(12) United States Patent
Lee et al.

(10) Patent No.: US 10,845,639 B2
(45) Date of Patent: Nov. 24, 2020

(54) DISPLAY DEVICE

(71) Applicant: LG Display Co., Ltd., Seoul (KR)

(72) Inventors: Taekeun Lee, Chilgok-gun (KR); Sunggyu Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/235,047

(22) Filed: Dec. 28, 2018

(65) Prior Publication Data

US 2019/0204671 A1 Jul. 4, 2019

(30) Foreign Application Priority Data

Dec. 29, 2017 (KR) .......................... 10-2017-0183578

(51) Int. Cl.
| | |
|---|---|
| *G02F 1/1335* | (2006.01) |
| *G02F 1/1333* | (2006.01) |
| *G02F 1/1362* | (2006.01) |
| *G02F 1/1368* | (2006.01) |
| *G02F 1/1343* | (2006.01) |

(Continued)

(52) U.S. Cl.
CPC ...... *G02F 1/133514* (2013.01); *G02F 1/1368* (2013.01); *G02F 1/13338* (2013.01); *G02F 1/133512* (2013.01); *G02F 1/134336* (2013.01); *G02F 1/136227* (2013.01); *G02F 1/136286* (2013.01); *G06F 3/041* (2013.01); *G06F 3/0412* (2013.01); *G06F 3/04164* (2019.05); *G09G 3/2003* (2013.01); *H01L 27/124* (2013.01); *G02F 1/13394* (2013.01); *G02F 1/134363* (2013.01); *G02F 2001/13685* (2013.01); *G02F 2001/133519* (2013.01); *G02F 2001/134345* (2013.01); *G02F 2201/14* (2013.01); *G02F 2201/52* (2013.01); *G06F 3/0443* (2019.05); *G09G 3/3275* (2013.01); *G09G 3/3607* (2013.01); *G09G 2300/0452* (2013.01); *G09G 2320/0242* (2013.01); *G09G 2340/06* (2013.01)

(58) Field of Classification Search
None
See application file for complete search history.

(56) References Cited

U.S. PATENT DOCUMENTS

| | | | | |
|---|---|---|---|---|
| 2010/0134728 A1* | 6/2010 | Kim | .................. | G02F 1/134363 349/106 |
| 2016/0314736 A1* | 10/2016 | Sang | .................... | G09G 3/3607 |
| 2017/0017327 A1* | 1/2017 | Chang | .................. | G06F 3/0412 |

FOREIGN PATENT DOCUMENTS

| | | |
|---|---|---|
| KR | 10-2011-0117613 A | 10/2011 |
| KR | 10-2012-0041510 A | 5/2012 |
| KR | 10-2014-0006180 A | 1/2014 |

\* cited by examiner

*Primary Examiner* — Aneeta Yodichkas
(74) *Attorney, Agent, or Firm* — Seed IP Law Group LLP

(57) ABSTRACT

Disclosed herein is a display device for increasing the transmittance of R, G, and B sub-pixels and reducing a transmittance of W sub-pixel through a pixel asymmetric design. To this end, the display device has a pixel asymmetric structure in which W sub-pixel has a different area from R, G and B sub-pixels. As a result, the display device has an asymmetric structure in which the areas of W, R, G, and B sub-pixels are different from one another, particularly, an asymmetric structure in which the area of W sub-pixel is reduced and the area of R sub-pixel is increased. Such design has a structural advantage that the transmittance of R, G, and B sub-pixels can be increased and the transmittance of W sub-pixel can be lowered so that it is possible to correspond the product specifications in various ways.

15 Claims, 8 Drawing Sheets

(51) Int. Cl.
*G02F 1/1339* (2006.01)
*G06F 3/041* (2006.01)
*G06F 3/044* (2006.01)
*H01L 27/12* (2006.01)
*G09G 3/20* (2006.01)
*G09G 3/3275* (2016.01)
*G09G 3/36* (2006.01)

DISPLAY DEVICE

CROSS-REFERENCE TO RELATED APPLICATION

This application claims priority to and the benefit of Korean Patent Application No. 10-2017-0183578, filed on Dec. 29, 2017, the disclosure of which is incorporated herein by reference in its entirety.

BACKGROUND

Technical Field

The present disclosure relates to a display device, and more particularly, to a display device designed to increase the transmittance of R, G, and B sub-pixels and to reduce a transmittance of W sub-pixel through a pixel asymmetric design.

Description of the Related Art

As the information society develops, a demand for a display device for displaying an image is increasing in various forms. Recently, various display devices such as a LCD (Liquid Crystal Display Device), a PDP (Plasma Display Panel), and an OLED (Organic Light Emitting Display Device) have been utilized.

Among them, the LCD is popularized with the advantages of a development of mass production technology, an ease of the driving means, low power consumption, a realization of a high image quality and a realization of a large screen, and an application field has been continuously expanded.

In a conventional LCD, three sub-pixels, i.e., R, G, and B sub-pixels form one unit pixel. Such a LCD adjusts a transmittance of a light irradiated from a backlight unit to R, G, and B sub-pixels to display a color image.

To this end, there is a problem that a luminance of the LCD degrades as the light generated from a light source of the backlight unit transmits R, G, and B sub-color filters arranged at a color filter substrate to display the color image. As a result, there has been a problem of degrading the display quality of an image.

BRIEF SUMMARY

In various embodiments, the present disclosure provides a display device designed to increase the transmittance of R, G, and B sub-pixels and to reduce a transmittance of W sub-pixel through a pixel asymmetric design to correspond to the product specifications.

To this end, the display device according to some embodiments of the present disclosure has a pixel asymmetric structure in which W sub-pixel is designed to have a different area from R, G and B sub-pixels.

That is, in the display device according to embodiments of the present disclosure, W sub-pixel has a first area and R, G, and B sub-pixels have a second area larger than the first area.

Accordingly, the display device according to embodiments of the present disclosure has an asymmetric structure in which the areas of W, R, G, and B sub-pixels are different from one another, particularly, the asymmetric structure in which an area of W sub-pixel is reduced and an area of R sub-pixel is increased. Accordingly, it has a structural advantage capable of increasing the transmittance of R, G and B sub-pixels and lowering the transmittance of W sub-pixel.

As a result, the display device according to embodiments of the present disclosure can adjust a W color coordinate balance by an area control of W sub-pixel through the asymmetric design of W, R, G, and B sub-pixels. In addition, since an increase in the transmittance of a pure color can be selectively controlled by the area control of R, G, and B sub-pixels, it becomes possible to correspond to the product specifications in various ways.

A display device in accordance with an embodiment of the present disclosure includes a thin film transistor substrate in which a plurality of W, R, G, and B sub-pixels are arranged in respective regions defined by intersections of a plurality of gate lines and a plurality of data lines, and a color filter substrate which faces the thin film transistor substrate and includes a plurality of W, R, G, and B sub-color filters are arranged corresponding to the plurality of W, R, G, and B sub-pixels, respectively.

In particular, in the display device in accordance with the embodiment of the present disclosure, each of the W sub-pixels has an area that is different from respective areas of the R, G, and B sub-pixels, and the R, G, and B sub-pixels may have areas that are larger than that of W sub-pixel.

To this end, in the display device in accordance with the embodiment of the present disclosure, W sub-pixel may have a first area, one of R, G, and B sub-pixels may have a second area larger than the first area, and remaining two of R, G, and B sub-pixels may have a third area larger than the first area and smaller than the second area. At this time, it is preferable that the second area has a larger area of 10% to 15% than the third area.

In other words, the display device in accordance with the embodiment of the present disclosure has an asymmetric structure in which the area of G sub-pixel arranged adjacent to W sub-pixel up and down is increased and the area of W sub-pixel is reduced by an area increase of G sub-pixel while maintaining the areas of R and B sub-pixels unchanged.

Accordingly, as the display device in accordance with the embodiments of the present disclosure has an asymmetric structure in which the areas of W, R, G, and B sub-pixels are different from one another, particularly, the asymmetric structure in which the area of W sub-pixel is reduced and the area of R sub-pixel is increased, it has a structural advantage in which the transmittance of R, G, and B sub-pixels can be increased and the transmittance of W sub-pixel can be lowered.

As a result, the display device according to the exemplary embodiment of the present disclosure can adjust a W color coordinate balance by the area control of W sub-pixel through the asymmetric design of W, R, G, and B sub-pixels. In addition, since the increase in the transmittance of the pure color of R, G, and B sub-pixels can be selectively controlled by the area control of R, G, and B sub-pixels, it becomes possible to correspond to the product specifications.

The display device according to the present disclosure has a structural advantage in that the transmittance of R, G, and B sub-pixels is increased and the transmittance of W sub-pixel is lowered through the pixel asymmetric design to correspond to the product specifications in various ways.

That is, the display device in accordance with the present disclosure has the asymmetric structure in which the area of G sub-pixel arranged adjacent to W sub-pixel up and down and the area of W sub-pixel is reduced by the area increase of G sub-pixel while maintaining the areas of R and B sub-pixels unchanged.

Accordingly, as the display device in accordance with the present disclosure has the asymmetric structure in which the areas of W, R, G, and B sub-pixels are different from one another, particularly the asymmetric structure in which the area of W sub-pixel is reduced and the area of R sub-pixel is increased, it has the structural advantage capable of increasing the transmittance of R, G, and B sub-pixels and lowering the transmittance of W sub-pixel.

As a result, the display device according to the present disclosure can adjust the W color coordinate balance by the area control of W sub-pixel through the asymmetric design of W, R, G, and B sub-pixels. In addition, since the increase in the transmittance of the pure color can be selectively controlled by area control of R, G, and B sub-pixels, it becomes possible to correspond to the product specifications in various ways.

DETAILED DESCRIPTION

Figure 1:
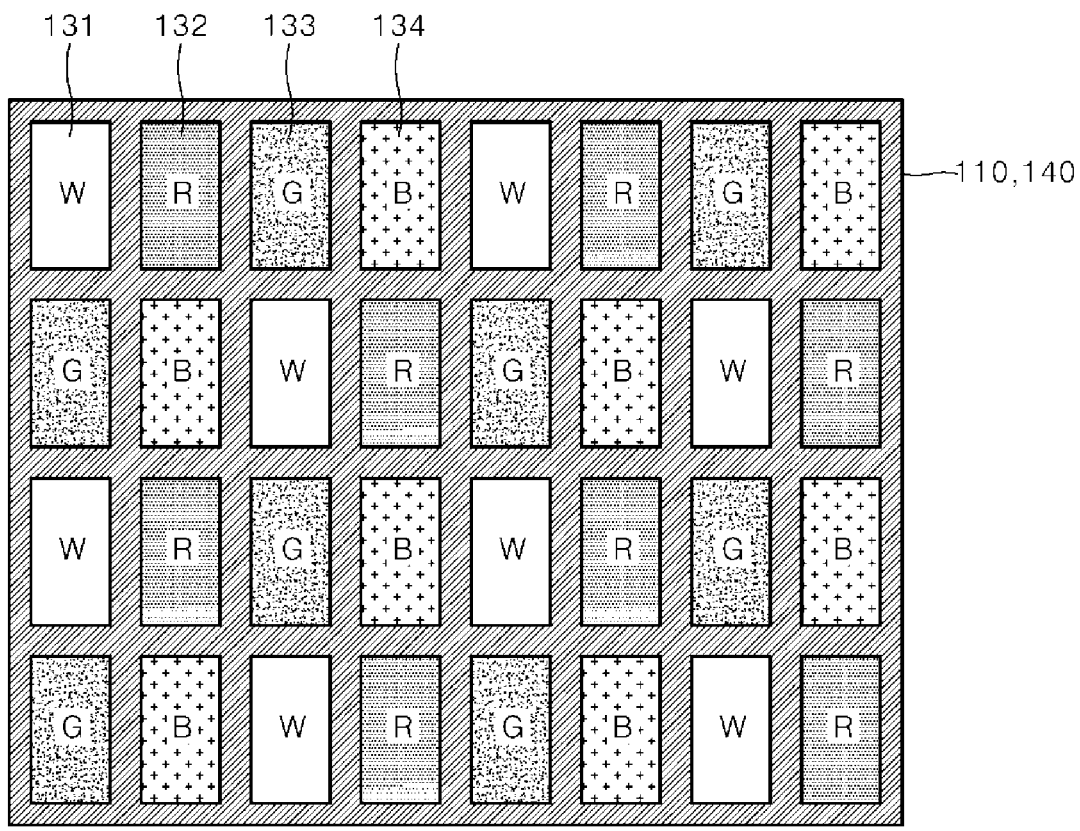
FIG. 1 is a plan view showing a display device in accordance with a first embodiment of the present disclosure.

The above-mentioned objects, features and advantages of the present disclosure will be described in detail with reference to the accompanying drawings, and accordingly, the technical idea of the present disclosure can be easily performed by those skilled in the art. In describing the present disclosure, when it is determined that the detailed description of the known technique related to the present disclosure may unnecessarily obscure the gist of the preset disclosure, a detailed description thereof will be omitted. Hereinafter, the preferred embodiments according to the present disclosure will be described in detail with reference to the accompanying drawings. In the drawings, the same reference numerals are used to indicate the same or similar components.

Hereinafter, the display device according to the preferred embodiments of the present disclosure will be described in detail with reference to the accompanying drawings.

FIG. 1 is a plan view showing a display device in accordance with a first embodiment of the present disclosure.

Referring to FIG. 1, a display device 100 in accordance with a first embodiment of the present disclosure includes a thin film transistor substrate 110 and a color filter substrate 140 which is attached opposite to the thin film transistor substrate 110. Further, although not shown in the drawings, the display device 100 in accordance with the first embodiment of the present disclosure may include a liquid crystal layer (not shown) interposed between the thin film transistor substrate 110 and the color filter substrate 140.

In the thin film transistor substrate 110, a plurality of white (W), red (R), green (G), and blue (B) sub-pixels 131, 132, 133, and 134 are arranged in respective regions or areas defined by intersections of a plurality of gate lines and data lines. As used herein, the term "intersection" means that two components cross over or overlap one another, and does not mean that the two components (e.g., a gate line and a data line) physically contact one another. Instead, a gate line and a data line may "intersect" one another at a region where they cross over or overlap one another, with one or more layers disposed between the gate line and the data line.

Further, although not shown in the drawings, the color filter substrate 140 includes a plurality of W, R, G, and B sub-color filters corresponding to the W, R, G, and B sub-pixels 131, 132, 133, and 134, respectively.

The display device 100 in accordance with the first embodiment of the present disclosure is designed such that W and R sub-pixels 131 and 132 form one unit pixel and G and B sub-pixels 133 and 134 form one unit pixel, and the areas of W, R, G, and B sub-pixels 131, 132, 133, and 134 have the same aperture ratio of 1:1:1:1.

As described above, the display device 100 in accordance with the first embodiment of the present disclosure can obtain an effect of increasing a luminance by increasing a transmittance of a light emitted from a backlight unit (not shown) by further including the W sub-pixel 131.

As a result, the display device 100 in accordance with the first embodiment of the present disclosure has an effect of increasing the transmittance approximately twice or more compared with a pixel structure of a conventional R, G, and B stripe arrangement.

However, the display device 100 in accordance with the first embodiment of the present disclosure described above has to be adjusted by the LED, which is a light source of the backlight unit, to adjust a color coordinate to a target value due to a design of the W sub-pixel 131 of a transparent pigment material. However, there is a problem that it is difficult to adjust a W color coordinate of R, G, and B sub-pixels 132, 133, and 134 to the target value when the LED is fixed.

Figure 2:
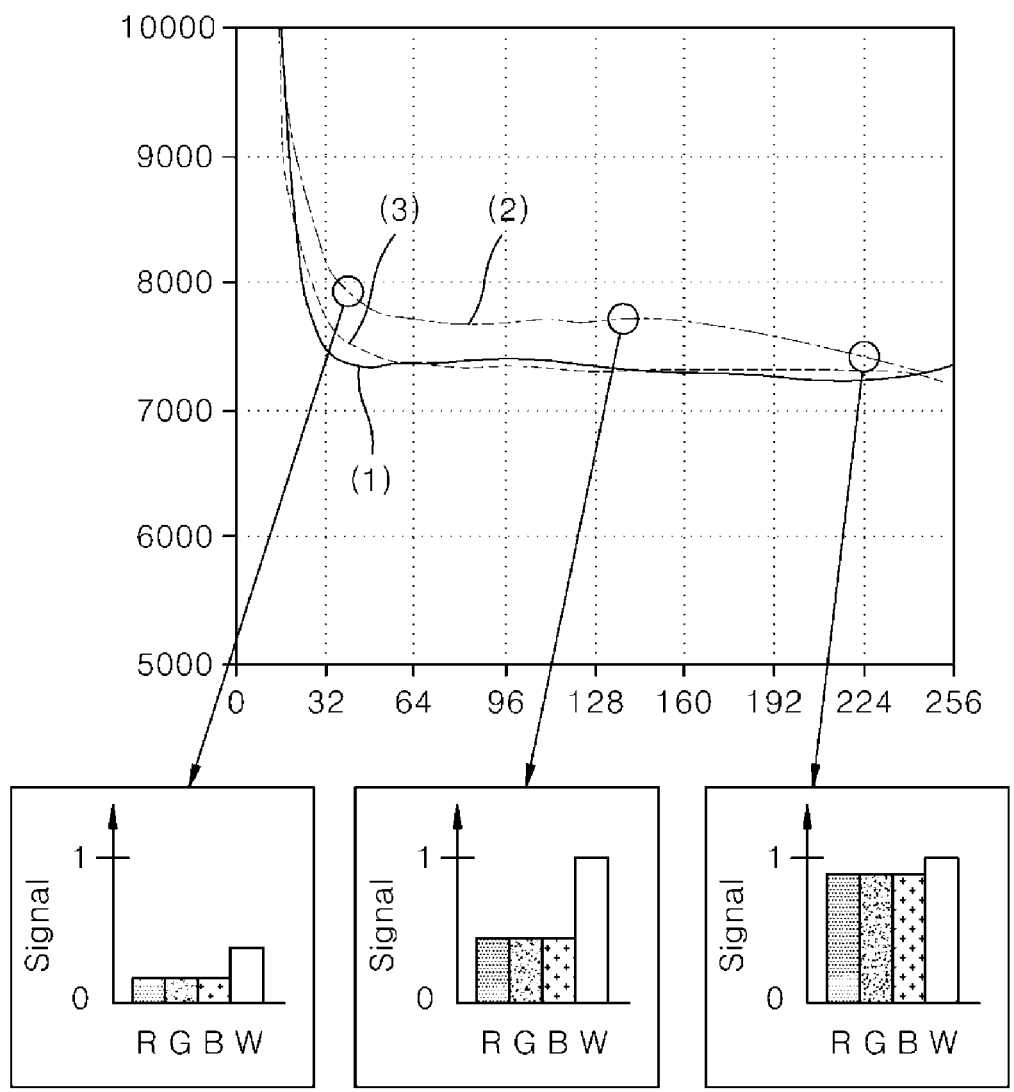
FIG. 2 is a graph showing the result of measurement of a color temperature for each gray scale for a display device in accordance with the first embodiment of the present disclosure.

FIG. 2 is a graph showing a result of measurement of a color temperature for each gray scale of a display device in accordance with a first embodiment of the present disclosure and will be described more specifically in conjunction with FIG. 1.

As shown in FIGS. 1 and 2, a display device 100 in accordance with a first embodiment of the present disclosure fixes a target value by an LED, which is a light source of the backlight unit to adjust the W color coordinate of W sub-pixel 131 to a target value. At this time, when R, G, and B sub-pixels 132, 133, 134 and the LED of the backlight unit do not match with the target value of the color coordinate, the color temperature for each gray scale is inconsistent to the pixel structure of R, G, and B stripe arrangement.

That is, there is a problem that reference value 1 (see FIG. 2) of R, G, and B sub-pixels 132, 133, and 134 is inconsistent to the values before a color matching 2 and after a color matching 3.

Further, in the display device 100 in accordance with the first embodiment of the present disclosure, a pure color transmittance of R, G, and B sub-pixels 132, 133, 134 is reduced to about 85 to 90% due to the further design of W sub-pixel 131 compared to the pixel structure of the R, G, and B stripe arrangement.

Accordingly, in the display device 100 in accordance with a first embodiment of the present disclosure, it can be recognized that an image quality is degraded due to the degraded transmittance compared to the pixel structure of R, G, and B strip arrangement due to the additional design of W sub-pixel 131 when a pure color image is derived.

In order to solve this problem, the display device in accordance with the second embodiment of the present disclosure is designed to increase the transmittance of RGB sub-pixel and reduce the transmittance of W sub-pixel through a pixel asymmetric design in order to correspond to the product specifications in various ways.

Hereinafter, this will be described more specifically with reference to the accompanying drawings.

Figure 3:
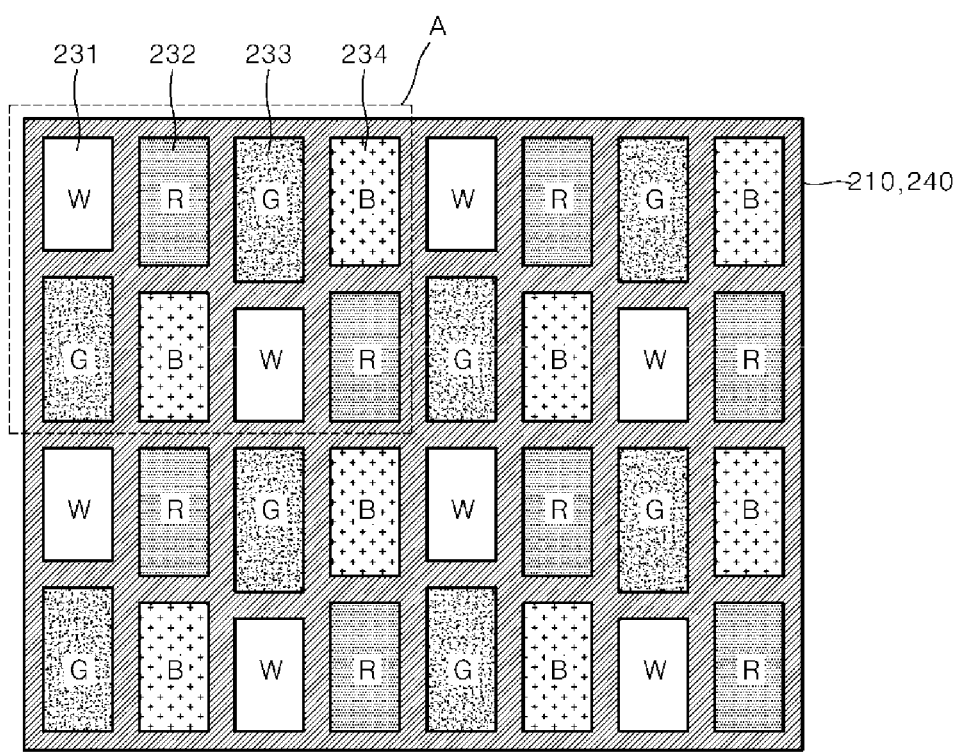
FIG. 3 is a plan view showing a display device in accordance with a second embodiment of the present disclosure.
Figure 4:
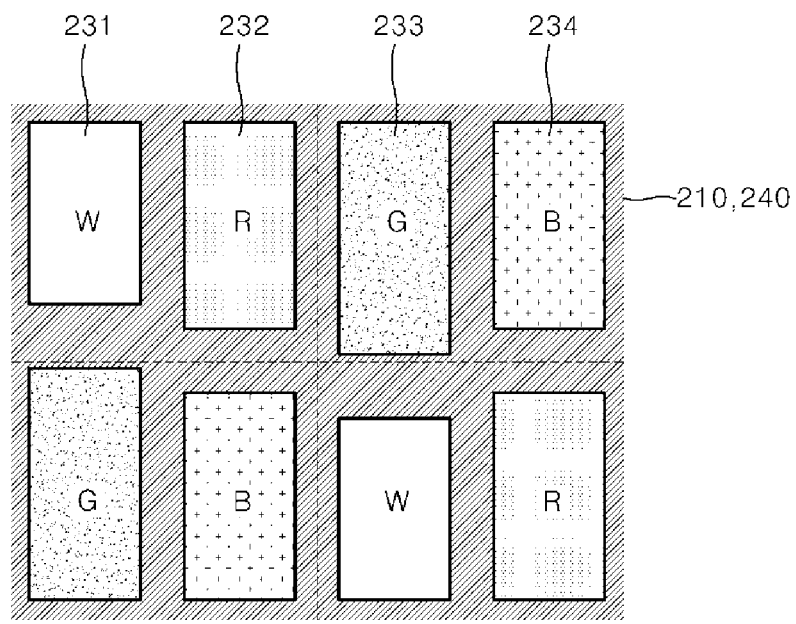
FIG. 4 is an enlarged plan view of portion A in FIG. 3.

FIG. 3 is a plan view showing a display device in accordance with a second embodiment of the present disclosure, and FIG. 4 is an enlarged plan view showing portion A of FIG. 3.

Referring to FIGS. 3 and 4, a display device 200 in accordance with a second embodiment of the present disclosure includes a thin film transistor substrate 210 and a color filter substrate 240 which is attached opposite to the thin film transistor substrate 210. Further, although not shown in the drawings, the display device 200 in accordance with the second embodiment of the present disclosure may include a liquid crystal layer (not shown) interposed between the thin film transistor substrate 210 and the color filter substrate 240.

In the thin film transistor substrate 210, a plurality of W, R, G, and B sub-pixels 231, 232, 233, and 234 are arranged in respective areas defined by the intersection of a plurality of gate wirings and data wirings.

Further, although not shown in the drawings, in the color filter substrate 240, a plurality of W, R, G, and B sub-color filters are arranged corresponding to W, R, G, and B sub-pixels 231, 232, 233, and 234, respectively. At this time, W sub-pixel 231 may have substantially the same area as W sub-color filter, R sub-pixel 232 may have substantially the same area as sub-color filter, G sub-pixel 233 may have substantially the same area as G sub-color filter, and B sub-pixel 234 may have substantially the same area as B sub-color filter.

Here, two sub-pixels of the plurality of W, R, G, and B sub-pixels 231, 232, 233, and 234 form one unit pixel. At this time, the plurality of W, R, G, and B sub-pixels 231, 232, 233, and 234 has a structure in which four unit pixels are repeatedly arranged in such a manner that a first row parallel to the plurality of gate lines is arranged in an order of W, R, G, and B sub-pixels 231, 232, 233, and 234 and a second row parallel to the first row is arranged in an order of G, B, W, and R sub-pixels 233, 234, 231, and 232.

In particular, in the display device 200 in accordance with the second embodiment of the present disclosure, W sub-pixel 231 has an area different from R, G, and B sub-pixels 232, 233, and 234, for a pixel asymmetric design. Accordingly, in the display device 200 in accordance with a second embodiment of the present disclosure, the area of at least one or more of W, R, G, and B sub-pixels 231, 232, 233, and 234 is designed differently, and the display device 200 therefore has an asymmetric structure that does not have an aperture ratio of 1:1:1:1.

That is, W sub-pixel 231 has a first area, and R, G, and B sub-pixels 232, 233, and 234 have a second area that is larger than the first area.

In some embodiments, W sub-pixel 231 has the first area, and one of R, G, and B sub-pixels 232, 233, and 234 has the second area larger than the first area. In addition, remaining two of R, G, and B sub-pixels 232, 233, and 234 have a third area that is larger than the first area and smaller than the second area.

As in FIG. 4, W sub-pixel 231 is designed to have the first area of the smallest area and G sub-pixel 233 is designed to have the second area larger than the first area. Further, R and B sub-pixels 232 and 234 are designed to have the third area that is larger than the first area and smaller than the second area.

That is, it has an asymmetric structure that the area of G sub-pixel 233 arranged adjacent to W sub-pixel 231 up and down is increased and the area of W sub-pixel 231 is reduced by an area increase of G sub-pixel 233 while maintaining the areas of R and B sub-pixels 232 and 234 unchanged.

In FIG. 4, the structure in which the areas of R and B sub-pixels 232 and 234 are maintained is shown and described. However, the area size of the third area, which is the areas of R and B sub-pixels 232 and 234 can be design-modified freely in a range larger than the first area, which is the area of W sub-pixel 231 and smaller than the second area, which is the area of G sub-pixel 233.

In particular, it is preferable that the second area has a larger area of 10% to 15% than the third area, and it is preferable that the first area has a smaller area of 10% to 15% than the third area. As described above, the second area is designed to have a larger area of 10% to 15% compared to the third area, and the first area is designed to have a smaller area of 10% to 15% than the third area so that the asymmetric structure in which the area of W sub-pixel 231 is reduced by an area increase of G sub-pixel 233 can be obtained.

By way of an example, when the third area has an area of width 20 μm×length 40 μm=800 μm$^2$, the second area may be designed as an area of 880 μm$^2$ (width 20 μm×length 44 μm) to 920 μm$^2$ (width 20 μm×length 46 μm), and the first area may be designed as an area of 680 μm$^2$ (width 20 μm×length 34 μm to 720 μm$^2$ (width 20 μm×length 36 μm).

Accordingly, the display device 200 in accordance with the second embodiment of the present disclosure has an asymmetric structure in which the areas of W, R, G, and B sub-pixels 231, 232, 233, and 234 are different from one another, particularly, the asymmetric structure in which the area of W sub-pixel 231 is reduced and the area of G sub-pixel 233 is increased. Accordingly, it has the structural advantage in which the transmittance of R, G, and B sub-pixels 232, 233, and 234 can be increased and the transmittance of W sub-pixel 231 can be lowered.

As a result, the display device 200 in accordance with the second embodiment of the present disclosure can control the W color coordinate balance by an area control of W sub-pixel 231 through the asymmetric design of W, R, G, and B sub-pixels 231, 232, 233, and 234. In addition, since an increase in the transmittance of a pure color can be selectively controlled by an area control of R, G, and B sub-pixels 233, 233, and 234, it becomes possible to correspond to the product specifications in various ways.

Figure 5:
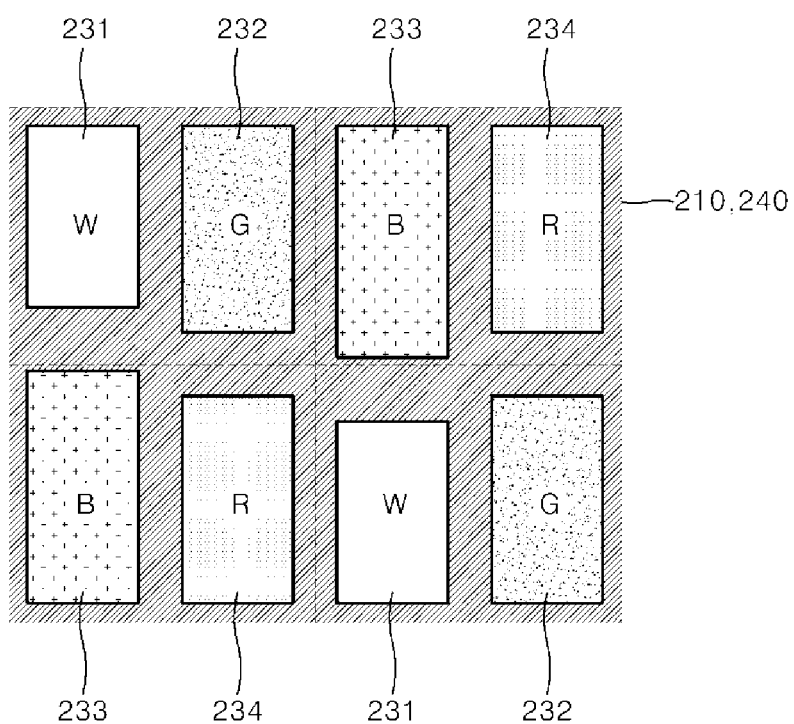
FIG. 5 is an enlarged plan view showing a display device in accordance with a modification of a second embodiment of the present disclosure.

FIG. 5 is an enlarged plan view showing a display device in accordance with a modification of the second embodiment of the present disclosure. At this time, the display device in accordance with the modification of the second embodiment of the present disclosure has substantially the same configuration as the second embodiment except for a pixel arrangement structure, and a repeated description will be omitted and the difference will be mainly described.

As shown in FIG. 5, in case of a display device 200 in accordance with an modification of the second embodiment of the present disclosure, a plurality of W, G, B, and R sub-pixels 231, 232, 233, and 234 have a structure in which four unit pixels are repeatedly arranged in such a manner that a first row parallel to a plurality of gate lines is arranged in an order of W, G, B, and R sub-pixels 231, 232, 233, and 234 and a second row parallel to the first row is arranged in an order of B, R, W, and G sub-pixels 233, 234, 231, and 232.

At this time, W sub-pixel 231 is designed to have a first area of the smallest area and B sub-pixel 233 is designed to have a second area larger than the first area. In addition, G and R sub-pixels 232 and 234 are designed to have a third area that is larger than the first area and smaller than the second area.

That is, it may be designed to have an asymmetric structure in which an area of B sub-pixel 233 arranged adjacent to W sub-pixel 231 up and down is increased and an area of W sub-pixel 231 is reduced by an area increase of B sub-pixel 233 while maintaining the areas of G and R sub-pixels 232 and 234 unchanged.

Although not shown in the drawings in detail, the plurality of W, B, R, and R sub-pixels 231, 232, 233, and 234 may have a structure in which four unit pixels are repeatedly arranged in such a manner that the first row parallel to the plurality of gate lines is arranged in an order of W, B, R, and G sub-pixels 231, 232, 233, and 234 and the second row parallel to the first row is arranged in an order of B, R, W, and G sub-pixels 233, 234, 231, and 232.

Figure 6:
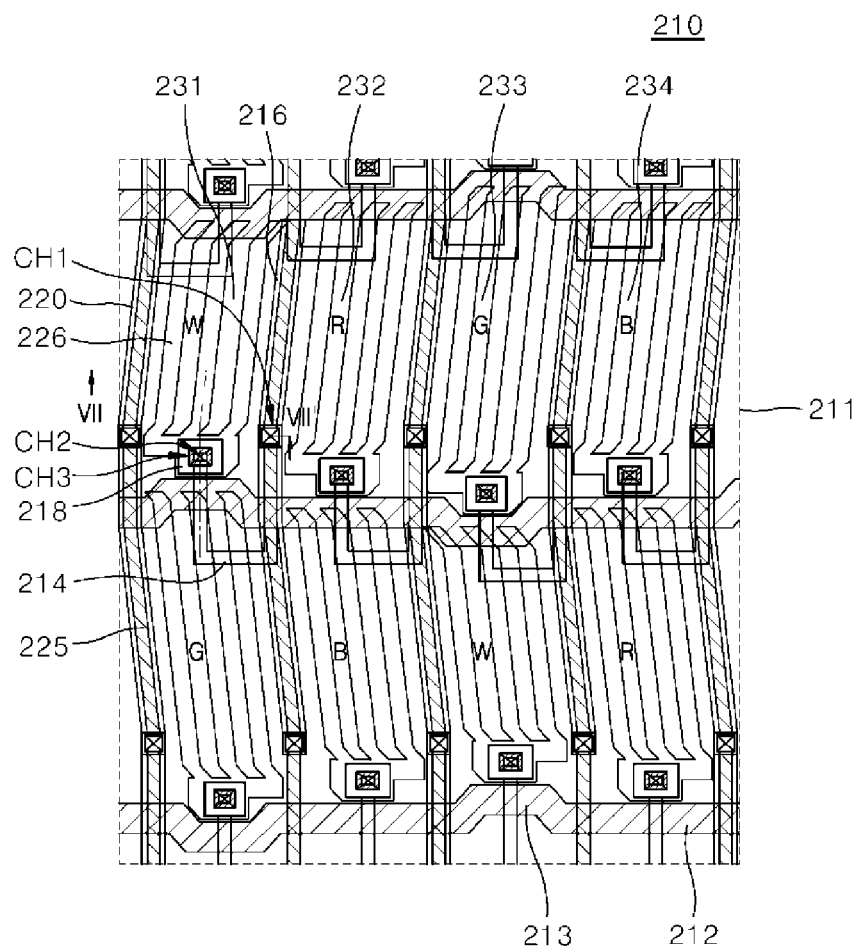
FIG. 6 is an enlarged plan view of a thin film transistor substrate of the display device shown in FIG. 4.
Figure 7:
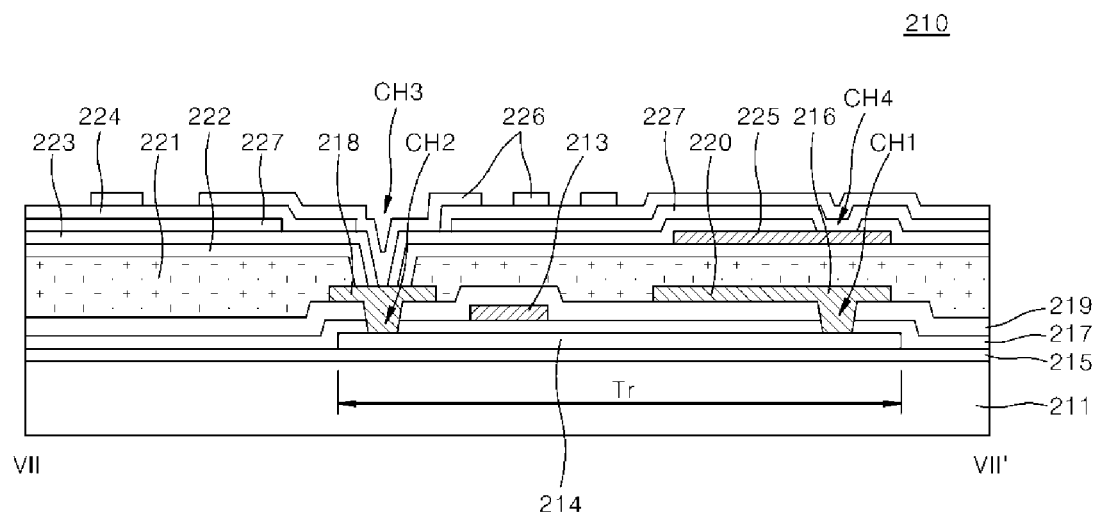
FIG. 7 is a cross-sectional view taken along line VII-VII' of FIG. 6.

Meanwhile, FIG. 6 is an enlarged plan view of the thin film transistor substrate of FIG. 4, and FIG. 7 is a cross-sectional view taken along line VII-VII' of FIG. 6.

As shown in FIGS. 6 and 7, a thin film transistor substrate 210 has a plurality of gate lines 212 arranged along a first direction on a first substrate 211, and plurality of data lines 200 arranged along a second direction intersecting with the plurality of gate lines 212.

At this time, as a material of a first substrate 211, a glass, a plastic, or the like may be used. A buffer layer 215 may be further arranged on the first substrate 211. The buffer layer 215 serves to prevent a degradation of the characteristic of the semiconductor layer 214 due to a release of an alkali ion eluted from the inside of the first substrate 211 during a crystallization of the semiconductor layer 214 of the thin film transistor Tr.

W, R, G, and B sub-pixels 231, 232, 233, and 234 are arranged respectively in an area defined by an intersection of a plurality of gate lines 212 and a plurality of data lines 220.

In addition, the thin film transistor substrate 210 further includes a plurality of thin film transistors Tr arranged at an intersection portion of the plurality of gate lines 212 and the plurality of data lines 220, respectively.

Each of the plurality of thin film transistors Tr may include a gate electrode 213, a gate insulating film 217, a source electrode 216, a drain electrode 218, an interlayer insulating film 219, and a semiconductor layer 214.

The gate insulating film 217 covers the semiconductor layer 214 arranged on the buffer layer 215 on the first substrate 211.

The gate electrode 213 is arranged on the gate insulating film 217 and can utilize a part of the gate line 212. That is, the gate electrode 213 may itself be a part of the gate line 212, for example, the gate electrode 213 may be a portion of the gate line 212. The source electrode 216 is arranged on the interlayer insulating film 219, and a part of the data line 220 can be utilized as the source electrode 216. That is, the source electrode 216 may be a portion of the data line 220.

The drain electrode 218 is arranged by being spaced apart from the source electrode 216 at an upper portion spaced apart from the gate line 212.

The semiconductor layer 214 is arranged on the buffer layer 215 on the first substrate 211. One end of the semiconductor layer 214 is connected to a source electrode 216, the other end thereof is connected to a drain electrode 218, and a part thereof is arranged to be overlapped with a gate electrode 213.

At this time, the semiconductor layer 214 may be formed of an amorphous silicon and polysilicon such as LTPS, HTPS, or the like. In addition, the semiconductor layer 214 can be formed by using an oxide semiconductor material such as ZO (Zinc Oxide), IGZO (Indium Galiumzinc Oxide), ZIO (Zinc Indium Oxide), ZGO (Ga doped ZnO).

The semiconductor layer 214 may have an active area which is arranged at the center and forms a channel, and the source and drain areas doped with impurities at high concentration on both sides having the active area therebetween.

The source and drain electrodes 216 and 218 are electrically connected to the source and drain areas of the semiconductor layer 214, respectively, through the source and drain contact holes CH1 and CH2, which expose a part of the source and drain areas. At this time, a flattening film 221 may be further arranged on the source and drain electrodes 216 and 218 and an interlayer insulating film 219. As the flattening film 221, an organic insulation material such as a Photo Acryl can be used.

A first protective film 222 may be arranged on the flattening film 221 and the second protective film 223 may be arranged on the first protective film 222 and a third protective film 224 may be further arranged on the second protective film 223. At this time, with regard to each of the first, second, and third protective films 222, 223, and 224, an inorganic material including $SiO_2$, $SiN_x$, or the like, or an inorganic material including Photo Acryl may be used, but is not limited thereto.

In addition, the thin film transistor substrate 210 may further include a plurality of pixel electrodes 226 which are connected to the plurality of thin film transistors Tr, respectively, and arranged at W, R, G, and B sub-pixels 231, 232, 233, and 234, respectively, and a common electrode 227 which is arranged to be overlapped with the plurality of pixel electrodes 226 between the plurality of thin film transistors Tr and the plurality of pixel electrodes 226.

At this time, the common electrode 227 may be arranged on the second protective film 223 and the pixel electrode 226 may be arranged on the third protective film 224. The common electrode 227 may be electrically connected to the drain electrode 218 through a pixel contact hole CH3 to expose a portion of the first, second, and third protective layers 222, 223, and 224. The common electrode 227 and the pixel electrode 226 may be formed of a transparent conductive material such as ITO (Indium Tin Oxide) or IZO (Indium Zinc Oxide), etc. The pixel electrode 226 may be arranged in W, R, G, and B sub-pixels, respectively, and designed in a form of a finger to generate an in-plane switching with the common electrode 227.

At this time, the thin film transistor substrate 210 according to the present disclosure has an asymmetric structure in which the area of G sub-pixel 233 arranged adjacent to W sub-pixel 231 up and down is increased and the area of W sub-pixel 231 is reduced by the area increase of G sub-pixel 233 while maintaining the areas of R and B sub-pixels 232 and 234 unchanged.

To this end, two neighboring gate lines 212 arranged in W sub-pixel 231 have a symmetric structure protruding inward with respect to the W sub-pixel 231, and two neighboring gate lines 212 arranged in any one of R, G, and B sub-pixels 232, 233, and 234 may have a symmetric structure protruding outward with respect to any of R, G, and B sub-pixels 232, 233, and 234.

By way of an example, as shown in FIG. 6, two neighboring gate lines 212 arranged in W sub-pixel 231 are protruded inward of W sub-pixel, and the neighboring gate lines 212 arranged in G sub-pixel 212 are protruded outward of G sub-pixel 233 to have a structure arranged inward of the adjacent W sub-pixel 231. Accordingly, the asymmetric structure can be obtained, which reduces the area of W sub-pixel 231 and increases the area of G sub-pixel 233.

At this time, the pixel electrode 226 arranged in W sub-pixel 231 has a first length and the pixel electrode 216 arranged in G sub-pixel 233 has a second length that is longer than the first length. In addition, the pixel electrode 226 arranged in R and B sub-pixels 232 and 234 have a third length longer than the first length and shorter than the second length.

In addition, the thin film transistor substrate 210 may further include a touch signal line 225 arranged on an upper portion overlapped with the data line 220 and electrically connected to the common electrode 227.

The touch signal line 225 is electrically connected to the common electrode 227 through a touch contact hole CH4 to expose a part of the second protective film 223.

Although not shown in the drawings in detail, the touch signal line 225 serves to transmit a common voltage generated in a common voltage supply unit to a plurality of touch electrodes in a display mode, and to transmit a touch driving signal to a plurality of touch electrodes in a touch mode.

Figure 8:
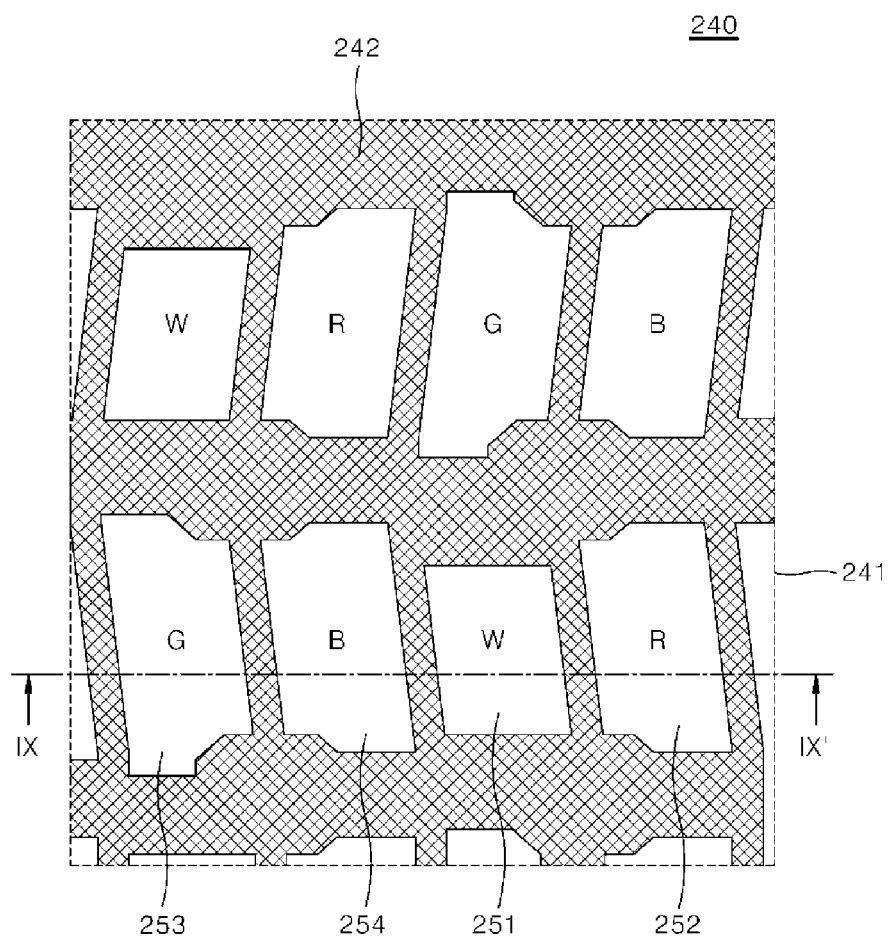
FIG. 8 is an enlarged plan view of the color filter substrate of the display device shown in FIG. 4.
Figure 9:
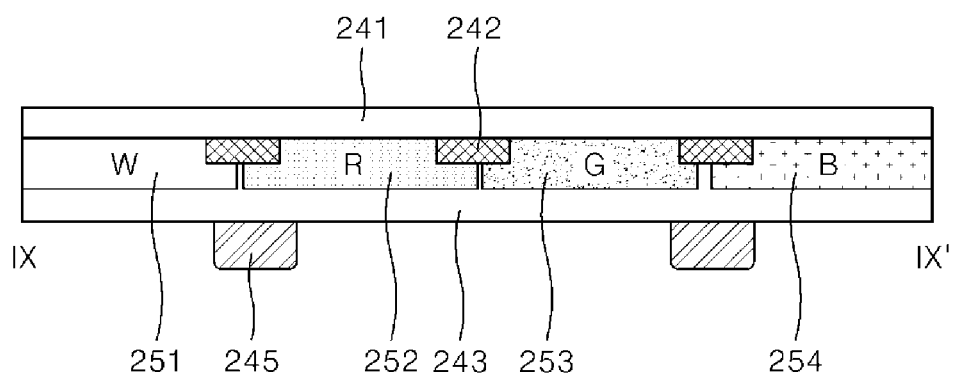
FIG. 9 is a cross-sectional view taken along line IX-IX' of FIG. 8.

Meanwhile, FIG. 8 is an enlarged plan view of the color filter substrate of FIG. 4, and FIG. 9 is a cross-sectional view taken along line IX-IX' of FIG. 8.

As shown in FIGS. 8 and 9, a color substrate 240 may include a second substrate 241, W, R, G, and B sub-color filters 251, 252, 253, and 254, and a black matrix 242, and an overcoat layer 243, and a column spacer 245.

As a material of the second substrate 241, a glass, a plastic, or the like can be used.

The plurality of W, R, G, and B sub-color filters 251, 252, 253, and 254 are arranged at a position corresponding to W, R, G, and B sub-pixels 231, 232, 233, and 234 (of FIG. 7) of the thin film transistor substrate (Tr of FIG. 7), respectively. At this time, W sub-pixel may have substantially the same area as the W sub-color filter 251, and R sub-pixel may have substantially the same area as the R sub-color filter 252. In addition, G sub-pixel may have substantially the same area as the G sub-color filter 253, and B sub-pixel may have substantially the same area as the B sub-color filter 254.

The black matrix 242 is arranged at a boundary area of a plurality of W, R, G, and B sub-color filters 251, 252, 253, and 254. An area of a plurality of W, R, G, and B sub-pixels can be defined by the black matrix 242, and an area of each sub-pixel can be substantially same as an aperture ratio.

The overcoat layer 243 covers a plurality of W, R, G, and B sub-color filters 251, 252, 253, and 254 and the black matrix 242.

The column spacer 245 is arranged on the overcoat layer 243 at a position corresponding to the black matrix 242. Accordingly, the column spacer 245 can be arranged at a position corresponding to an intersection portion between a plurality of gate lines (212 in FIG. 6) and the plurality of data lines (220 in FIG. 6) of the first substrate 241. Although the column spacer 245 may be arranged on a thin film transistor substrate, since the color filter substrate 240 has a relatively small number of processes, it is more preferable to arrange it on the color filter substrate 240 considering a process aspect.

As described above, the display device in accordance with the second embodiment of the present disclosure has a structural advantage in that the transmittance of R, G, and B sub-pixels are increased and the transmittance of W sub-pixel is lowered through the pixel asymmetric design to correspond to the product specifications in various ways.

That is, the display device in accordance with the second embodiment of the present disclosure has the asymmetric structure in which the area of G sub-pixel arranged adjacent to W sub-pixel up and down and the area of W sub-pixel is reduced by the area increase of G sub-pixel while maintaining the areas of the R and G sub-pixels unchanged.

Accordingly, the display device in accordance with the second embodiment of the present disclosure has the asymmetric structure in which the areas of W, R, G, and B sub-pixels are different from one another, particularly, the asymmetric structure in which the area of W sub-pixel is reduced and the area of R sub-pixel is increased. Accordingly, it has the structural advantage that the transmittance of R, G, and B sub-pixels can be increased and the transmittance of W sub-pixel can be lowered.

As a result, the display device in accordance with the second embodiment of the present disclosure can adjust the W color coordinate balance by the area control of W sub-pixel through the asymmetric design of W, R, G, and B sub-pixels. In addition, since the increase in the transmittance of the pure color of R, G, and B sub-pixels can be selectively controlled by the area control of R, G, and B sub-pixels, it becomes possible to correspond to the product specifications in various ways.

While the embodiments of the present disclosure have been mainly described, various modifications and changes can be made within a level of those skilled in the art. It is therefore to be understood that such modifications and changes are included within the scope of the present disclosure unless the modifications and changes do not depart from the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
a thin film transistor substrate including a plurality of white (W), red (R), green (G), and blue (B) sub-pixels arranged in respective regions formed adjacent to overlapping locations of a plurality of gate lines and a plurality of data lines; and
a color filter substrate which faces the thin film transistor substrate and includes a plurality of W, R, G, and B sub-color filters arranged corresponding to the plurality of W, R, G, and B sub-pixels, respectively,
wherein two gate lines arranged in a respective one of the W sub-pixels have a symmetric structure protruding inward with respect to the W sub-pixel, and wherein two gate lines arranged in any one of R, G, and B sub-pixels have a symmetric structure protruding outward with respect to the any one of R, G, and B sub-pixels.

2. The display device of claim 1, wherein the respective areas of the R, G, and B sub-pixels are larger than the area of each of the W sub-pixels.

3. The display device of claim 1, wherein each of the W sub-pixels has a first area, wherein one of the R, G, and B sub-pixels has a second area that is larger than the first area, and wherein a remaining two of the R, G, and B sub-pixels have a third area that is larger than the first area and smaller than the second area.

4. The display device of claim 3, wherein the second area is within a range of 10% to 15% larger than the third area.

5. The display device of claim 1, wherein two sub-pixels of the plurality of W, R, G, and B sub-pixels form one unit pixel.

6. The display device of claim 5, wherein a W sub-pixel and an adjacent R sub-pixel in a first row form a first unit pixel, and a G sub-pixel and an adjacent B sub-pixel in the first row form a second unit pixel.

7. The display device of claim 6, wherein a G sub-pixel and an adjacent B sub-pixel in a second row form a third unit pixel, and a W sub-pixel and an adjacent R sub-pixel in the second row form a fourth unit pixel.

8. The display device of claim 7, wherein the first and third unit pixels are adjacent to one another along a direction transverse to a row direction, and the second and fourth unit pixels are adjacent to one another along the direction transverse to the row direction.

9. The display device of claim 5, wherein the plurality of W, R, G, and B sub-pixels includes a first row parallel to the plurality of gate lines in which the sub-pixels are arranged in a repeating order of W, R, G, and B sub-pixels, and a second row parallel to the first row in which the sub-pixels are arranged in a repeating order of G, B, W, and R sub-pixels, the G sub-pixels of the second row being adjacent to the W sub-pixels of the first row along a direction transverse to the plurality of gate lines.

10. The display device of claim 1, wherein the thin film transistor substrate comprises:
the plurality of gate lines arranged along a first direction on a first substrate;
the plurality of data lines arranged along a second direction overlapping the first direction;
a plurality of thin film transistors arranged adjacent to overlapping locations between the plurality of gate lines and the plurality of data lines, respectively;
a plurality of pixel electrodes respectively connected to the plurality of thin film transistors, and arranged in the plurality of W, R, G, and B sub-pixels, respectively; and
a common electrode arranged between the plurality of thin film transistors and the plurality of pixel electrodes, the common electrode at least partially overlapped with the plurality of pixel electrodes.

11. The display device of claim 10, wherein each of the plurality of thin film transistors comprises:
a gate electrode that is a part of one of the gate lines;
a source electrode that is a part of one of the data lines;
a drain electrode spaced apart from the source electrode; and
a semiconductor layer having a first end connected to the source electrode and a second end connected to the drain electrode, a part of the semiconductor layer overlapping with the gate electrode.

12. The display device of claim 10, wherein the thin film transistor substrate further comprises a touch signal line overlapped with the data line and electrically connected to the common electrode.

13. The display device of claim 1, wherein the color filter substrate comprises:
the plurality of W, R, G, and B sub-color filters arranged at positions corresponding to the plurality of W, R, G, and B sub-pixels, respectively;
a black matrix arranged at a boundary area of the plurality of W, R, G, and B sub-color filters;
an overcoat layer covering the plurality of W, R, G, and B sub-color filters and the black matrix; and
a column spacer arranged at a position corresponding to the black matrix on the overcoat layer and corresponding to an overlapping portion between the plurality of gate lines and the plurality of data lines.

14. The display device of claim 1, wherein the W sub-pixels have a different area than the R, G, and B sub-pixels.

15. The display device of claim 1, wherein the plurality of W, R, G, and B sub-pixels includes a first row parallel to the plurality of gate lines in which the sub-pixels are arranged in a repeating order of W, G, B and R sub-pixel, and a second row parallel to the first row in which the sub-pixels are arranged in a repeating order of B, R, W, and G sub-pixels, the B sub-pixels of the second row being adjacent to the W sub-pixels of the first row along a direction transverse to the plurality of gate lines.

* * * * *